(12) United States Patent
Liikanen

(10) Patent No.: US 11,211,131 B2
(45) Date of Patent: Dec. 28, 2021

(54) ADJUSTING PROGRAM EFFECTIVE TIME USING PROGRAM STEP CHARACTERISTICS

(71) Applicant: Micron Technology, Inc., Boise, ID (US)

(72) Inventor: Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 16/214,373

(22) Filed: Dec. 10, 2018

(65) Prior Publication Data

US 2020/0185042 A1 Jun. 11, 2020

(51) Int. Cl.
| | | |
|---|---|---|
| *G11C 16/32* | (2006.01) | |
| *G11C 16/10* | (2006.01) | |
| *G11C 16/34* | (2006.01) | |
| *G06F 3/06* | (2006.01) | |
| *G11C 16/04* | (2006.01) | |

(52) U.S. Cl.
CPC ............ *G11C 16/32* (2013.01); *G06F 3/0604* (2013.01); *G06F 3/0629* (2013.01); *G06F 3/0679* (2013.01); *G11C 16/10* (2013.01); *G11C 16/349* (2013.01); *G11C 16/0483* (2013.01)

(58) Field of Classification Search
CPC ....... G11C 16/32; G11C 16/10; G11C 16/349; G11C 16/0483; G06F 3/0629; G06F 3/0604; G06F 3/0679
See application file for complete search history.

(56) References Cited

U.S. PATENT DOCUMENTS

| | | | |
|---|---|---|---|
| 8,862,969 B2 | 10/2014 | Liikanen et al. | |
| 10,510,413 B1* | 12/2019 | Diep | ............... G11C 16/24 |
| 2002/0191444 A1* | 12/2002 | Gregori | ............... G11C 11/5628 365/185.19 |
| 2006/0018160 A1* | 1/2006 | Moogat | ............... G11C 16/10 365/185.18 |
| 2008/0137432 A1* | 6/2008 | Lee | ............... G11C 29/021 365/185.19 |
| 2008/0298124 A1* | 12/2008 | Wong | ............... G11C 11/5628 365/185.03 |
| 2012/0011301 A1* | 1/2012 | Goss | ............... G11C 16/10 711/103 |
| 2016/0093380 A1* | 3/2016 | Dong | ............... G11C 16/10 365/185.19 |
| 2018/0341552 A1 | 11/2018 | Liikanen et al. | |

OTHER PUBLICATIONS

U.S. Appl. No. 15/981,835, entitled "Memory System Quality Margin Analysis and Configuration", filed May 16, 2018, (40 pgs.).
U.S. Appl. No. 16/182,399, entitled "Memory Element Profiling and Operational Adjustments", filed Nov. 6, 2018, (34 pgs.).
U.S. Appl. No. 16/121,565, entitled "Memory Characterization and Sub-System Modification", filed Sep. 4, 2018, (41 pgs.).

* cited by examiner

*Primary Examiner* — Jerome Leboeuf
(74) *Attorney, Agent, or Firm* — Brooks, Cameron & Huebsch, PLLC

(57) ABSTRACT

A program effective time (PET) for programming at least a portion of a plurality of memory cells based on one or more program step characteristics is determined. The determined PET and a target PET is compared. In response to the determined PET being different than the target PET, the one or more program step characteristics is adjusted to adjust the determined PET to the target PET.

18 Claims, 7 Drawing Sheets

ADJUSTING PROGRAM EFFECTIVE TIME USING PROGRAM STEP CHARACTERISTICS

TECHNICAL FIELD

Embodiments of the disclosure relate generally to memory sub-systems, and more specifically, relate to adjustment of a program effective time for programming memory cells.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
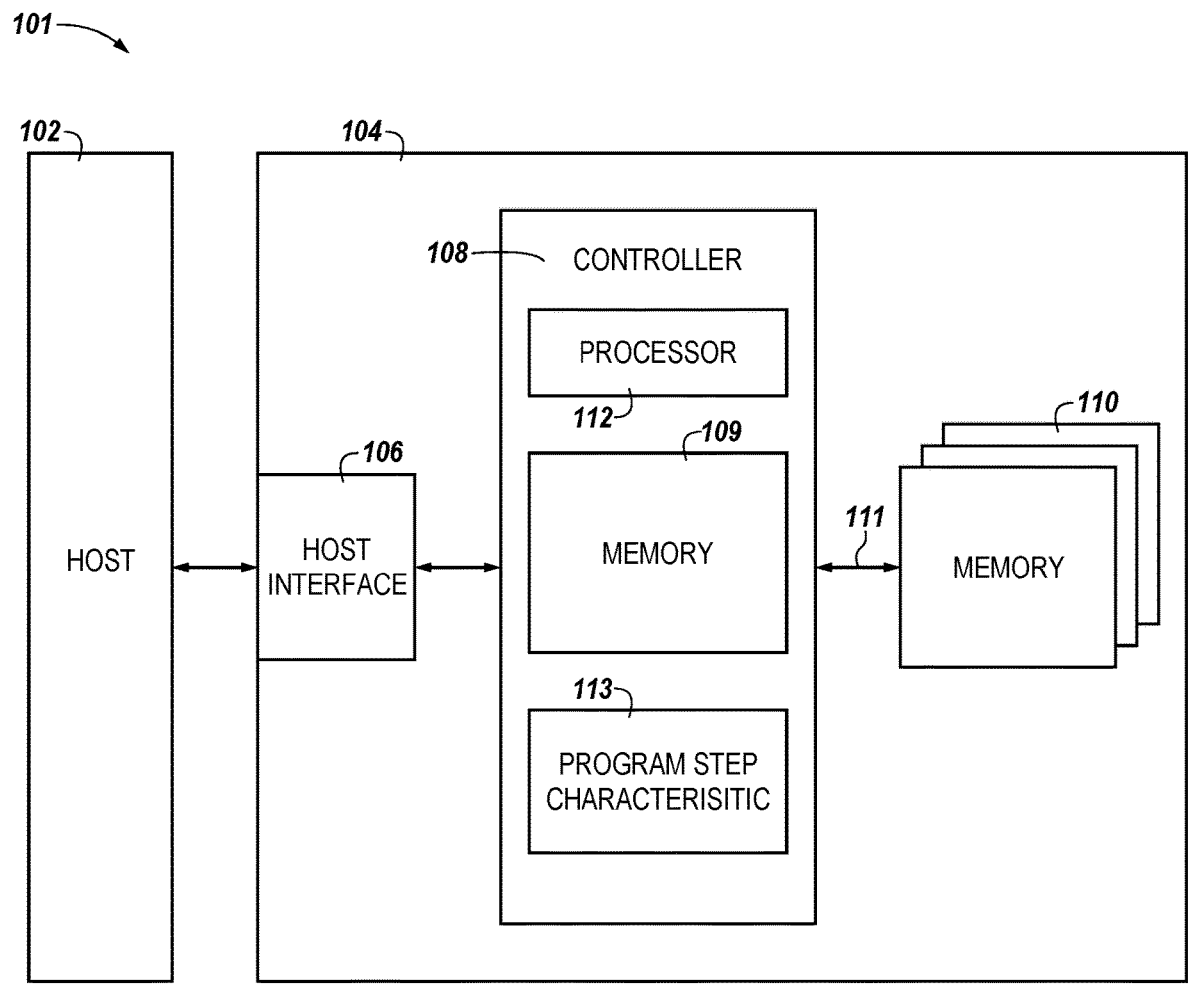
FIG. 1 illustrates an example computing environment that includes a memory sub-system in accordance with some embodiments of the present disclosure.

Aspects of the present disclosure are directed to managing program effective time within a memory sub-system. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

For example, various memory components (e.g., dies) can have different associated program effective times (PETs), which can adversely affect system write performance. Various previous approaches may not provide an ability to adequately and/or accurately adjust PET. Conventional memory sub-systems do not dynamically adjust PET and/or are not be capable of adjusting the PET in a predictable and/or controllable manner. Therefore, various conventional systems are not able to, for example, maintain a target PET with changing temperature and/or program/erase cycling. Therefore, it can be beneficial to provide the ability to adjust (e.g., tune) the PET in order to reduce PET variance among memory components to improve system performance. PET can refer to, for example, the time to fully program a page of cells, which may include multiple logical pages of data. Furthermore, the ability to adjust PET can provide benefits such as product diversification by allowing the tuning of PET to meet different product specifications. For example, PET may be decreased in order to provide increase data reliability or PET may be increased to provide increased quality of service (e.g., speed).

In various memory sub-systems, programming cells can involve providing a programming signal to a group of cells (e.g., a page) to place them in target states, which correspond to respective stored data patterns. For example, the cells can be non-volatile flash memory cells configured to store one or more bits of data per cell. A programming signal used to program the cells can comprise, for instance, a series of voltage pulses. The voltage pulses have various characteristics which can affect the PET. Such characteristics include pulse magnitude, step size between pulses, and pulse duration, among various other characteristics.

In various memory sub-systems, programming cells can involve providing a programming signal to a group of cells (e.g., a page) to place them in target states, which correspond to respective stored data patterns. For example, the cells can be non-volatile flash memory cells configured to store one or more bits of data per cell. As an example, a programming signal used to program the cells can comprise a stepped voltage signal (e.g., voltage ramp) with each step having an associated step size (referred to as a program step size) and duration (referred to as program step duration). The programming signal can be applied (e.g., to a word line) as a series of voltage pulses, for instance. The voltage pulses have various characteristics which can affect a PET associated with the programmed cells. Such characteristics include pulse magnitude, step size between pulses, and pulse duration, among various other characteristics.

Aspects of the present disclosure provide the ability to finely control the PET (e.g., to achieve a target PET) based on a determined relationships between a program step size and PET and between a program step duration and PET, which is used to fine tune the PET. For example, the relationships between the program step size and the PET and the program step duration and the PET can be determined and used to adjust either or both of the program step size and the program step duration to a achieve a particular (e.g., constant) PET. As an example, a feedback loop of a previous PET can be used to determine an amount of adjustment to the program step size, the program step duration, or a combination of such, based on the relationship in response to a current PET being different than a target PET.

In this way, a fine control of the program effective time can allow for programming of multiple memory dies using a same measured effective time which can reduce a distribution of programming times and thereby improve overall system write performance by minimizing die to die program time variations. In addition, a method such as that described below can improve drive to drive program time variation by having all drives use the same program step duration. This can maintain a consistent program effective time over the life of a memory die even in reaction to programming changes that occur due to wear cycling and/or due to temperature fluctuations.

FIG. 1 illustrates an example computing environment 101 that includes a memory sub-system 104 in accordance with some embodiments of the present disclosure. As used herein, a memory sub-system 104, a processing resource (e.g., a controller) 108, or memory components 110 might also be separately considered an "apparatus." The memory sub-system 104 can be a solid state drive (SSD), for instance, and can include a host interface 106, a processing resource 108 (e.g., a controller and/or other control circuitry), and a memory 110, which can include a number of memory components (e.g., NAND flash components) providing a storage volume for the memory sub-system 104. The memory sub-system 104 can be a single memory device.

As illustrated in FIG. 1, the processing resource 108 can be coupled to the host interface 106 and to the memory components 110 via a memory interface 111 and can be used to send data between the memory sub-system 104 and a host 102. The memory interface 111 can be one of various interface types compliant with a particular standard such as Open NAND Flash interface (ONFi).

Host 102 can be a host system such as a personal laptop computer, a desktop computer, a digital camera, a mobile telephone, or a memory card reader, among various other types of hosts. Host 102 can include a system motherboard and/or backplane and can include a number of processors. Host 102 can also be a processing resource, such as where memory sub-system 104 is a memory device having an on-die controller (e.g., 108).

The host system 102 can be coupled to the memory sub-system 104 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory 104. The host system 102 can further utilize an NVM Express (NVMe) interface to access the memory components 110 when the memory sub-system 104 is coupled with the host system 102 by a PCIe interface. The physical host interface can provide an interface for passing control, address, data, and other signals between the memory sub-system 104 and the host system 102.

The processing resource 108 can communicate with the memory components 110 (which in some embodiments can be a number of memory arrays on a single die) to control data read, write, and erase operations, among other operations. In some embodiments, the processing resource 108 can be on the same die or a different die than the memory components 110.

Although not specifically illustrated, in some embodiments, the processing resource 108 can include a discrete memory channel controller for each channel coupling the processing resource 108 to a number of memory components, including memory components 110. The processing resource 108 can include, for example, a number of components in the form of hardware and/or firmware (e.g., one or more integrated circuits) and/or software for controlling access to the number of memory components and/or for facilitating data transfer between the host 102 and memory components 110.

As illustrated in FIG. 1, the processing resource 108 can include a memory (e.g., local memory) 109 and a processing device 112. For example, the memory 109 can include latches and circuitry. The memory 109 can have discrete components such as an application specific integrated circuit (ASIC) or the components may reflect functionally provided by circuitry within the processing resource 108 that does not necessarily have a discrete physical form separate from other portions of the processing resource 108. Although illustrated as components within the processing resource 108 in FIG. 1, the memory 109 can be external to the processing resource 108 or have a number of components located within the processing resource 108 and a number of components located external to the processing resource 108.

The memory components 110 can include a number of arrays of memory cells (e.g., non-volatile memory cells). The arrays can be flash arrays with a NAND architecture, for example. However, embodiments are not limited to a particular type of memory array or array architecture. Although floating-gate type flash memory cells in a NAND architecture are generally referred to herein, embodiments are not so limited. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device. The memory components 110 can also include additionally circuitry (not illustrated), such as control circuitry, buffers, address circuitry, etc.

In operation, data can be written to and/or read from memory (e.g., memory components 110 of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

The memory components 110 can include any combination of the different types of non-volatile memory components and/or volatile memory components. An example of non-volatile memory components includes a negative-and (NAND) type flash memory. The memory components 110 can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 102. Although non-volatile memory components such as NAND type flash memory are described, the memory components 110 can be based on various other types of memory such as a volatile memory. In some embodiments, the memory components 110 can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 110 can be grouped as memory pages or data blocks that can refer to a unit of the memory component used to store data.

The processing resource 108 (which may be referred to as "controller" 108) can communicate with the memory components 110 to perform operations such as reading data, writing data, or erasing data at the memory components 110 and other such operations. The controller 108 can include hardware such as one or more integrated circuits and/or discrete components, a buffer memory, or a combination thereof. The controller 108 can be a microcontroller, special purpose logic circuitry (e.g., a field programmable gate array (FPGA), an application specific integrated circuit (ASIC), etc.), or other suitable processor. The controller 108 can include a processing resource (e.g., processing device 112) configured to execute instructions stored in local memory 109. In the illustrated example, the local memory 109 of the controller 108 includes an embedded memory configured to store instructions for performing various processes, operations, logic flows, and routines that control operation of the memory sub-system 104, including handling communications between the memory sub-system 104 and the host system 102. In some embodiments, the local memory 109 can include memory registers storing memory pointers, fetched data, etc. The local memory 109 can also include read-only memory (ROM) for storing micro-code. While the example memory sub-system 104 in FIG. 1 has been illustrated as including the controller 108, in another embodiment of the present disclosure, a memory sub-system 104 may not include a controller 108, and may instead rely upon external control (e.g., provided by an external host, such as by a processing device separate from the memory sub-system 104).

The controller 108 can use and/or store various operating parameters associated with programming the memory cells. Such operating parameters can include programming pulse magnitude, step size, pulse duration, program verify voltages, etc. for various different programming processes. The different programming processes can include processes to program cells to store different quantities of bits, and different multiple pass programming process types (e.g., 2-pass, 3-pass, etc.). In general, the controller 108 can receive commands or operations from the host system 102 and can convert the commands or operations into instructions or appropriate commands to achieve the desired access to the memory components 110. The controller 108 can be responsible for other operations such as wear leveling operations, garbage collection operations, error detection and error-correcting code (ECC) operations, encryption operations, caching operations, and address translations between a logical block address and a physical block address that are associated with the memory components 110. The controller 108 can further include host interface circuitry to communicate with the host system 102 via the physical host interface. The host interface circuitry can convert the commands received from the host system into command instructions to access the memory components 110 as well as convert responses associated with the memory components 110 into information for the host system 102.

The memory sub-system 104 can also include additional circuitry or components that are not illustrated. For instance, the memory components 110 can include control circuitry, address circuitry (e.g., row and column decode circuitry), and/or input/output (I/O) circuitry by which they can communicate with controller 108 and/or host 102. As an example, in some embodiments, the address circuitry (can receive an address from the controller 108 and decode the address to access the memory components 110.

In various embodiments, the controller 108 can include a program step characteristic component 113 that can determine and/or control one or more program step characteristics used to program cells. The characteristics can be, for example, a size of a stepped voltage signal (e.g., a program step size). In another example, the characteristic can be a duration of a stepped voltage signal (e.g., a program step duration).

The memory components 110 can include memory cells for the write or program operation, such as for incremental step pulse programming (ISPP). The memory cells can be programmed (via controller) via an ISPP process in which a series of pulses of increasing magnitude are applied to the cells (to their gates) to increase the stored charge by a particular amount until the target stored charge (Vt) is reached.

Figure 2:
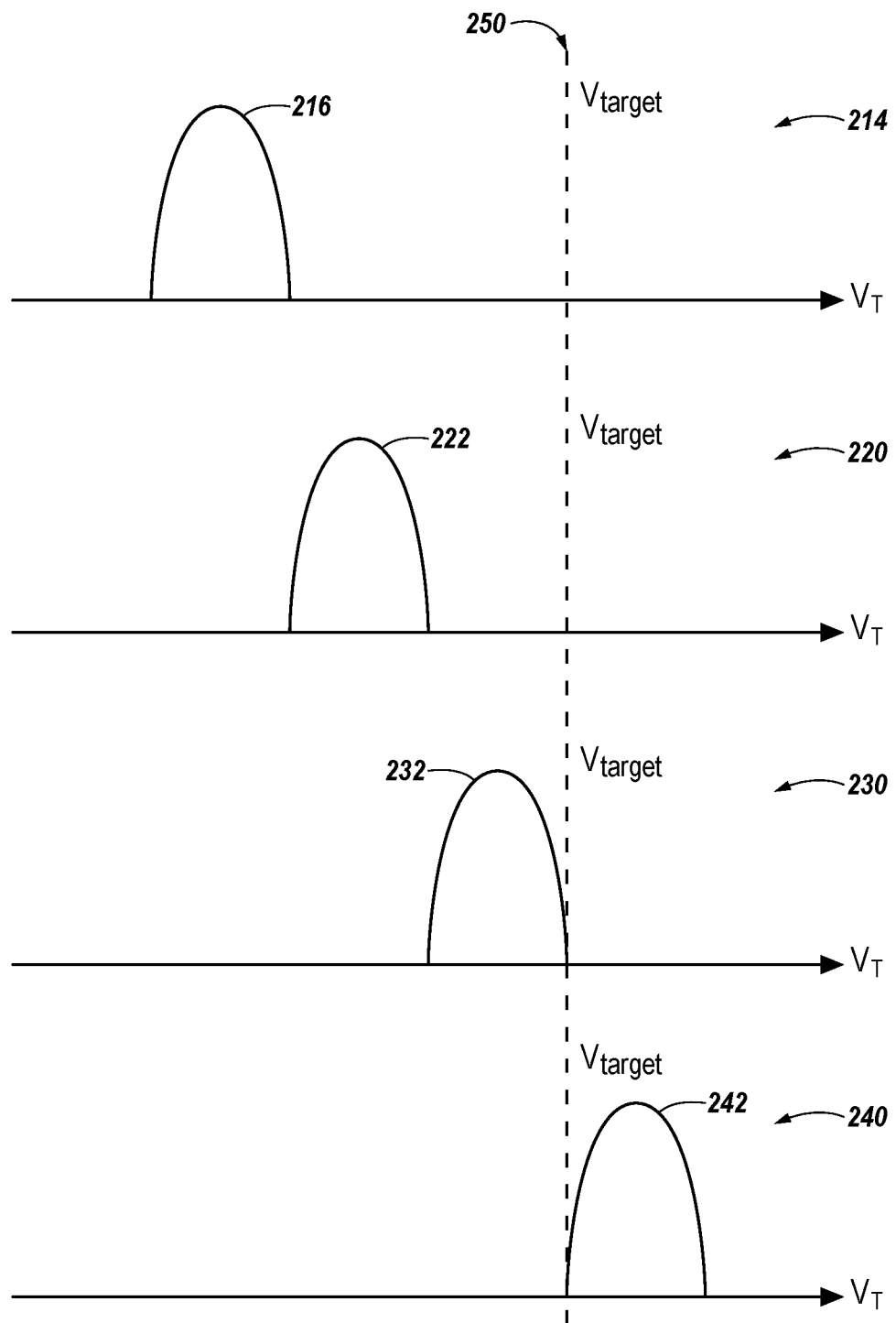
FIG. 2 illustrates an example of programming memory cells in accordance with some embodiments of the present disclosure.

For example, FIG. 2 illustrates threshold voltage (Vt) distributions of cells, which correspond to the charge stored on the charge storage structures of the memory cells, at various stages of one such incremental programming operation. Time 214 can represent a time at which the programming operation begins. Accordingly, as shown by Vt distribution 216, at time 214 the Vt of all the cells is below the target Vt level (Vtarget) 250. To program the memory cells to the desired target Vtarget 250, a series of programming steps (e.g., voltage pulses) can be used at each of a number of subsequent times 220, 230 and 240 to increase the cell Vt levels as shown by distributions 222, 232 and 242, respectively. After each programming step, a program verify operation can be performed to verify whether the cells being programmed have reached Vtarget 250. As shown in FIG. 2, programming of the cells is completed at time 240, as the Vt levels of all the cells have been increased to at or above the desired target Vt level 250, the programming operation is completed.

The amount by which the Vt distributions 216, 222, 232, and 242 increase responsive to an applied programming pulse can depend on various factors such as the magnitude of the pulse and the duration for which the pulse is applied to the cells. Accordingly, the time to program a group of cells to desired states can vary depending upon the programming signal characteristics as well as the quantity of pulses. Additionally, as described further below, multiple programming passes can be used to program multiple logical page data to cells. For example a first pass, which may be referred to as a lower page programming process, can be used to program one or more lower pages of data to a group of cells, and one or more subsequent programming passes can be used to program additional pages of data to the group of cells.

Figure 3:
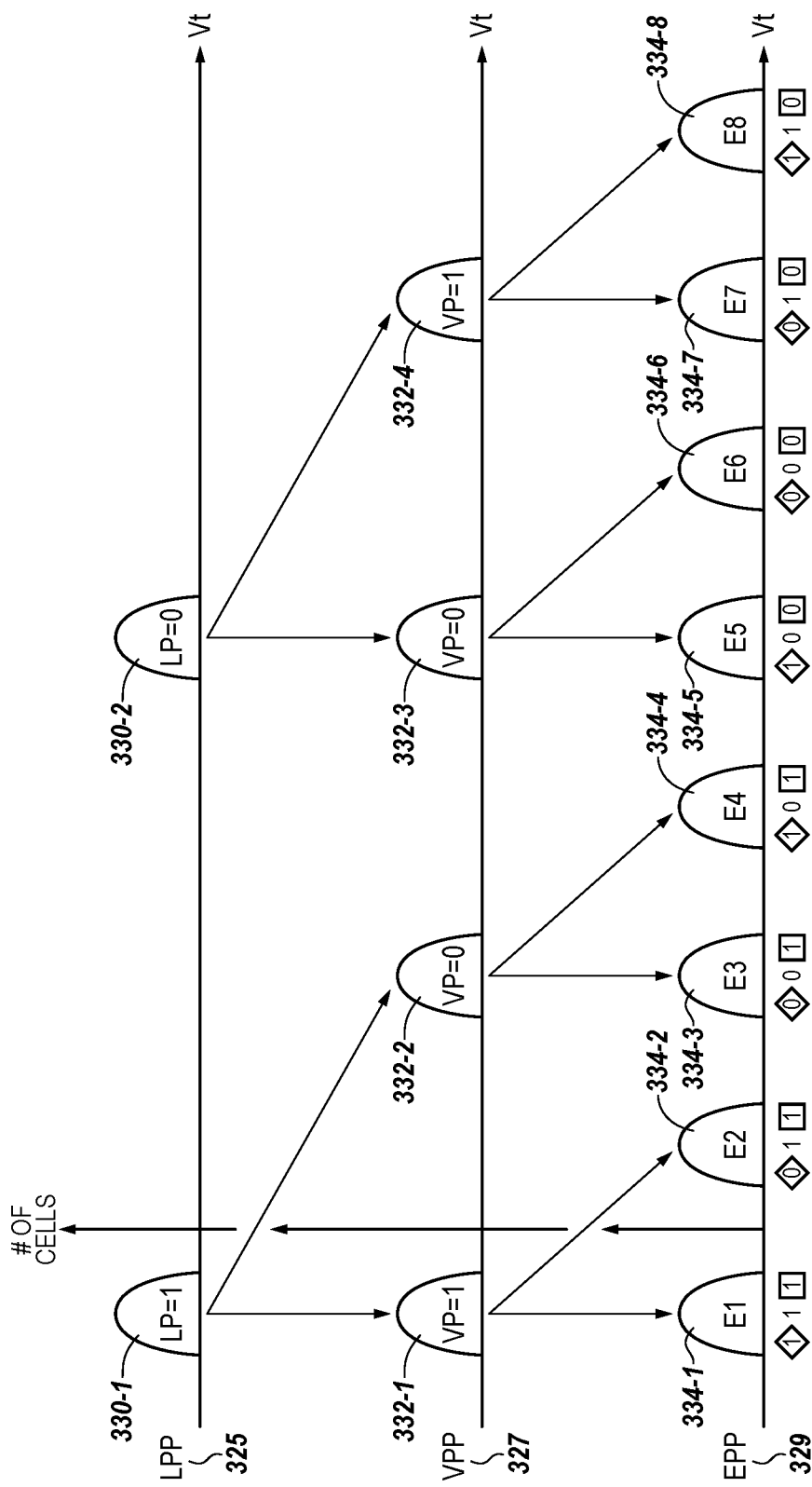
FIG. 3 illustrates an example of programming memory cells in accordance with some embodiments of the present disclosure.

The diagram shown in FIG. 3 illustrates threshold voltage (Vt) distributions associated with a programming process that can be performed in accordance with embodiments of the present disclosure. In this example, the process is a two-pass programming process in which a lower page (e.g., lease significant bit) of a group of memory cells is programmed in a first programming pass and an upper page (e.g., middle bit) and extra page (e.g., most significant bit) of the group are programmed in a second programming pass. The first programming pass can be referred to as a lower page programming (LPP) process 325, and the second programming pass can be referred to as an upper page programming and extra page programming process (UPP/EPP) 329.

As described further below, each of the LPP process 325 and UPP/EPP process 329 can involve application of a series of programming pulses to a selected word line corresponding to the group of cells being programmed. As part of the LPP process 325, the Vt of the memory cells are adjusted (e.g., from an erased Vt level) to one of two levels represented by Vt distributions 330-1 and 330-2. The voltage levels are represented by Vt distributions, which can reflect a statistical average Vt level of cells programmed to a particular level. In this example, cells whose lower page is to store a bit value of "1" (e.g., LP=1) are programmed to distribution 330-1 during LPP process 325, and cells whose lower page is to store a bit value of "0" (e.g., LP=0) are programmed to distribution 330-2 during LPP process 325. A lower page is a lower order page and is programmed in the array of memory cells before higher order pages are programmed.

As part of the UPP/EPP process 329, the Vt of the memory cells are adjusted to one of eight levels represented by Vt distributions 334-1 to 334-8, which correspond to data states E1 to E8, respectively, with each one of the data states E1 to E8 representing a different 3-bit stored data pattern. In this example, cells programmed to data state E1 store data "111," cells programmed to data state E2 store data "011," cells programmed to data state E3 store data "001," cells programmed to data state E4 store data "101," cells programmed to data state E5 store data "100," cells programmed to data state E6 store data "000," cells programmed to data state E7 store data "010," and cells programmed to data state E8 store data "110." While the example illustration includes a 2-pass programming, this is but one example. Additional quantities of program passes can be used. An example calculation for the illustrated 2-pass programming can include a ((Pass 1+Pass 2)/3) determination (as is further described in association with FIG. 5 below). As the two passes are used for programming three separate bits, this calculation can determine an average duration (e.g., time) per page (corresponding to a bit) to perform the programming. However, additional passes, additional bits, etc. can be used for the programming and determination of program duration.

Figure 4A:
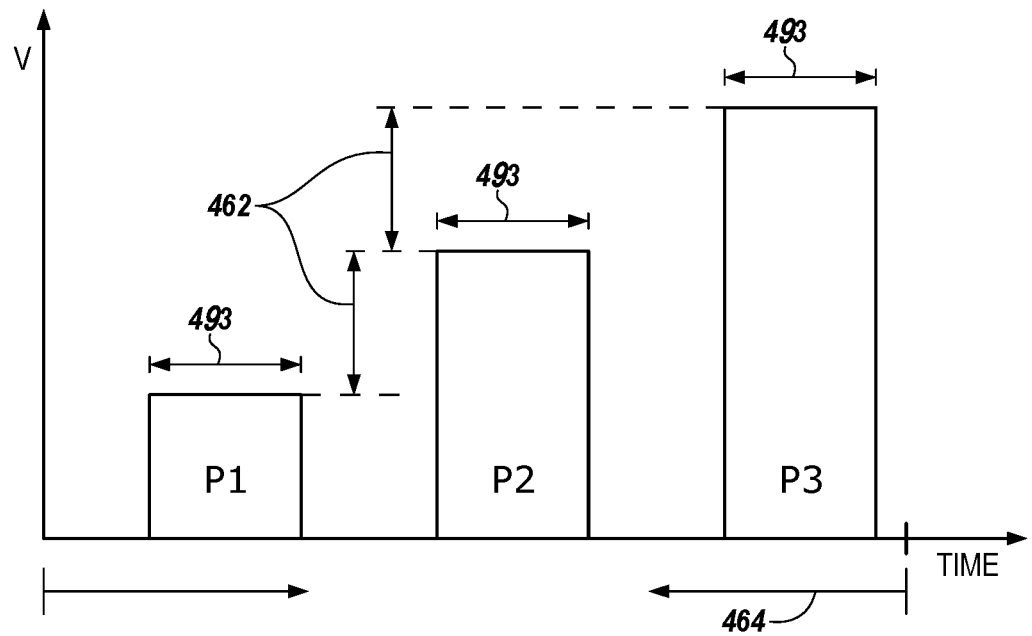
FIG. 4A-B each illustrate an example of programming steps for programming memory cells in accordance with embodiments of the present disclosure.
Figure 4B:
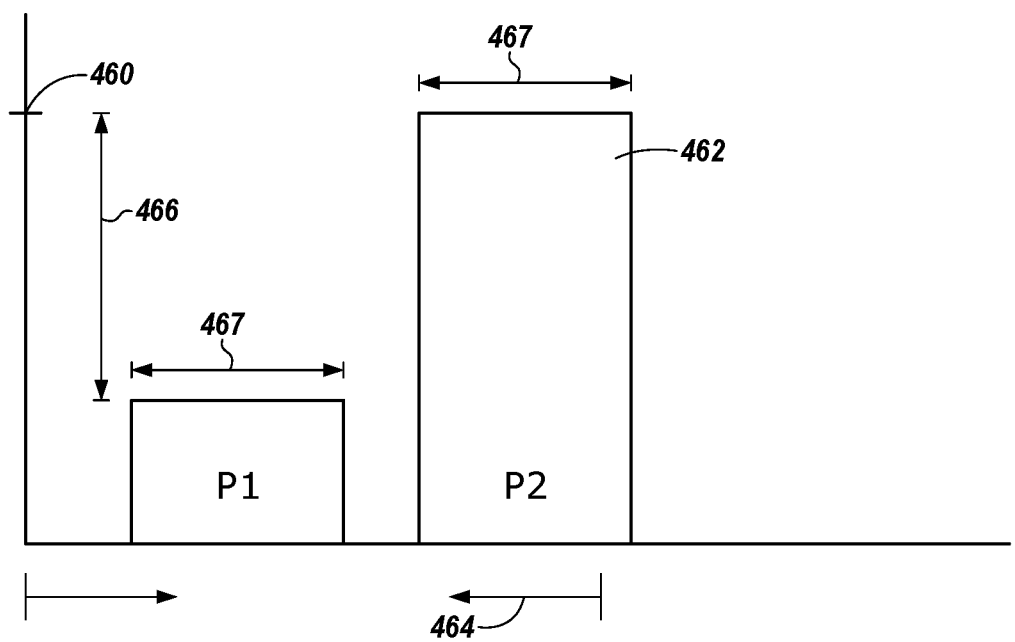

FIG. 4A-B each illustrate example programming signals in accordance with embodiments of the present disclosure. The example illustrations represent programming pulses applied to memory cells (e.g., to their gates) to increase the cell threshold voltages (Vts) to target levels. FIG. 4A illustrates a number of pulses P1, P2, and P3 associated with a programming operation having a particular PET 464. As shown in FIG. 4A, each pulse has a pulse duration 493, which may be referred to as a program step duration, and a program step size 462 between consecutive pulses.

The PET 464 can be associated with a series of pulses (e.g., P1, P2, P3) applied to a group of cells to place the cells of the group in respective target states. For example, the PET 464 can correspond for the amount of time to program each of a group of cells to one of the states E1 to E8 shown in FIG. 3. The memory system can dynamically increase or decrease the programming step size 462 and/or step duration 493, which will correspondingly increase or decrease the programming effective time 464 by a particular amount based on determined relationships. In at least one example, this dynamic increase or decrease can be performed by the program step characteristic component 113 to dynamically adjust or calibrate the programming step size 462 and/or duration 493.

FIG. 4B illustrates the programming operation after implementing a programming step adjustment. For comparison, the previous program step size and program step durations, such as 462 and 493, respectively, in FIG. 4A, are illustrated with programming level voltage 460 along the x-axis. The adjusted program step size 466 is a calibrated or changed instance of the program step size 462 for replacing the program step size 462. The adjusted program step size 466 is illustrated as being greater than the program step size 462, however, adjustments can be an increase or a decrease in the program step size. Likewise, the adjusted program step duration 467 is a calibrated or changed instance of the program step duration 493 for replacing the program step duration 493. The adjusted program step duration 467 is illustrated as being greater than the program step duration 493, however, adjustments can be an increase or a decrease in the program step duration depending on a desired change in the PET. As described further below, a relationship may exist between the adjustment of a program step size and the adjustment of the program step duration. That is, the adjustment of the program step size can be in a particular proportion to the adjustment of the program step duration based on a relationship between the program step size and the program step duration, resulting in a target program effective time.

Dynamically adjusting the program step size 462 to increase to the program step size 466 and adjusting the program step duration 493 to increase to the program step duration 467 provides the benefit of a decreased program effective time 464, as illustrated in FIG. 4B. As illustrated in this example, the increase in the program step size and program step duration can reduce the number of pulses used to reach the programming level voltage of P2 in FIG. 4B. Thus, the dynamic adjustment of the program effective time by adjusting one or more program step characteristics (e.g., one or more of a program step size and a program step duration) can improve the overall efficiency for the memory system.

Moreover, the adjustment of one or more program step characteristics can be generated based on a feedback measure, or a processing result thereof, by adjusting based on a threshold program effective time to stay above or below. As an example, as a program effective time goes above a threshold program effective time (PET), a program step size and/or a program step duration can be adjusted to decrease the PET. Vice versa, as a program effective time goes below a threshold PET, a program step size and/or a program step duration can be adjusted to increase the PET.

Figure 5:
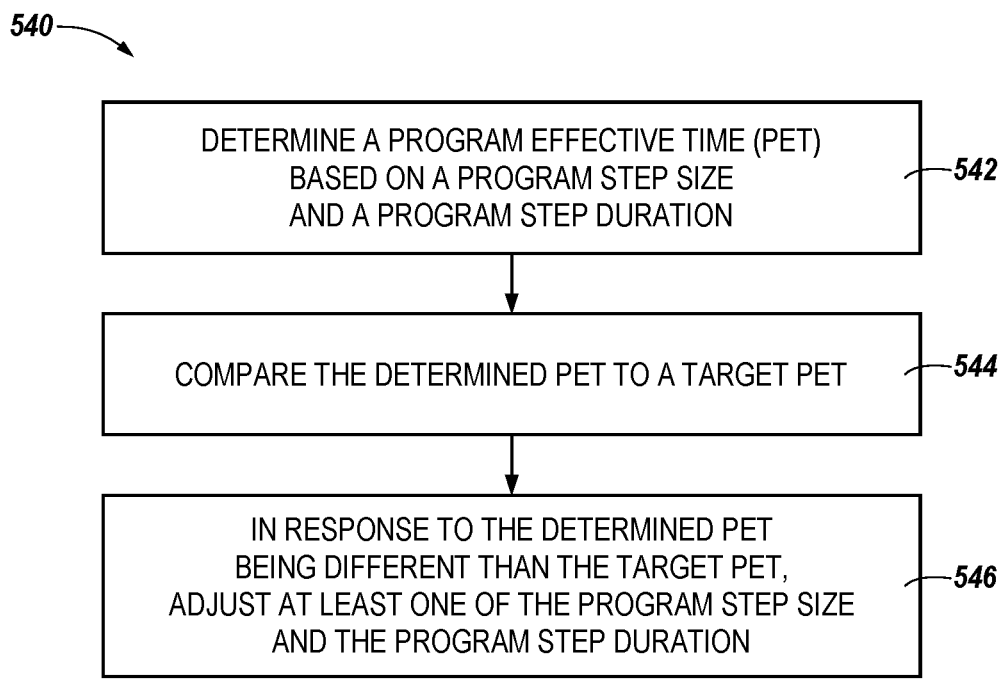
FIG. 5 is a flow diagram of an example method corresponding to adjusting one or more program step characteristics for programming memory cells in accordance with some embodiments of the present disclosure.

FIG. 5 is a flow diagram of an example method 540 corresponding to adjusting one or more program step characteristics (e.g., one or more of a program step size and a program step duration) for programming memory cells in accordance with some embodiments of the present disclosure. The method 540 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 540 is performed by the program step characteristic component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 542, the processing device determines a program effective time (PET) based on one or more program step characteristics. One or more of the program step characteristics can include a program step size and a program step duration. A relationship can exist between a program step size (e.g., program gate step size) and a PET. A relationship can exist between a program step duration (e.g., a program pulse duration time) and the PET. These relationships can be combined and used to correspond (e.g., in a linear or nonlinear relationship) to the change in PET with a particular resolution (e.g., a higher resolution). In this example, the change in program effective time ("DeltaPET") can be equal to a change in program step size ("DeltaProgramStep") plus a change in program step duration ("DeltaProgramTime"), as demonstrated by the formula:

DeltaPET=DeltaProgramStep+DeltaProgramTime where a known delta of a program step duration can be equivalent to one increment of a program step size. As an example, if one increment of a program step size results in a 5% change in PET and "n" number of increments of delta program step duration also results in a 5% change in PET, then changing the PET time by 5% can be accomplished by either changing the program step size by one increment or changing the program step duration by n number of increments. To change the effective program by only 2%, the program step size can remain the same and the program step duration delta could be adjusted by (2%/5%)*n. To change the PET by 13%, the program step size delta could be 2, resulting in 2*5%=10% plus a change in the program step duration of (3%/5%)*n.

In one example, the two relationships can be treated as linear relationships. In one example, the two relationships that affect programming time can be represented by a formula which can include dependencies and non-linear effects. In another example, the relationships can be represented as tables which are indexed in a linear fashion but output differing amounts based on their index. In this example where the delta program step size and the delta program step duration are used as a function, the combination of the two parameters can be computed for a given change in PET. As an example:

[Program Step, ProgramTime]=funcProgramStep_ProgramTime(PETdelta)

In the example where the delta program step size and the delta program step duration is used as a table lookup, the combination of the two parameters can be pre-computed for a given change in PET, such as in the following table:

TABLE 1

| TableIndex | ProgramStep | ProgramTime | PETdelta |
|---|---|---|---|
| 0 | −2 | 0 | −2.00 |
| 2 | −2 | 7 | −1.50 |
| 3 | −1 | 0 | −1.00 |
| 5 | −1 | 10 | −0.50 |
| 6 | 0 | 0 | 0.00 |
| 8 | 0 | 10 | 0.50 |
| 9 | 1 | 0 | 1.00 |
| 11 | 1 | 10 | 1.50 |
| 12 | 2 | 0 | 2.00 |
| 14 | 2 | 12 | 2.50 |

Note that the program step duration for the table index of 2 is 7 and the program step duration for the table index of 14 is 12, illustrating a non-linear relationship.

In relation to program step duration, in at least one example, program step duration can be measured by counting clock cycles of a known frequency between a time a program command was issued to a memory (e.g., a NAND) and when the memory programming operation is complete. In another example, the program step duration can be measured by using a number of program pulses used to complete the memory program operation and apply a known amount of time for each pulse. PET can be calculated by using multiple measurements of differing page types or differing programming operations and computing a metric that is used as a feedback for controlling a dynamic PET (DPET). As an example:

PET=tPROG ((pass1+pass2)/3)

In at least one example, if PET is greater than a user specified time, then the step time value can be incremented, and vice versa the step time value can be decremented.

At block 544, the processing device compares the determined PET to a specific PET. The specific PET can be provided by an input to the memory system. The specific PET can be provided based on an error threshold and/or other parameters or thresholds that can limit a PET value. At block 546, the processing device adjusts, in response to the determined PET being different than the target PET, one of the program step characteristics (e.g., one of a program step size and a program step duration). As indicated in Table 1 above, either of these parameters can be adjusted, or both can be adjusted, to achieve a particular PET that can be in line with the specific PET.

Figure 6:
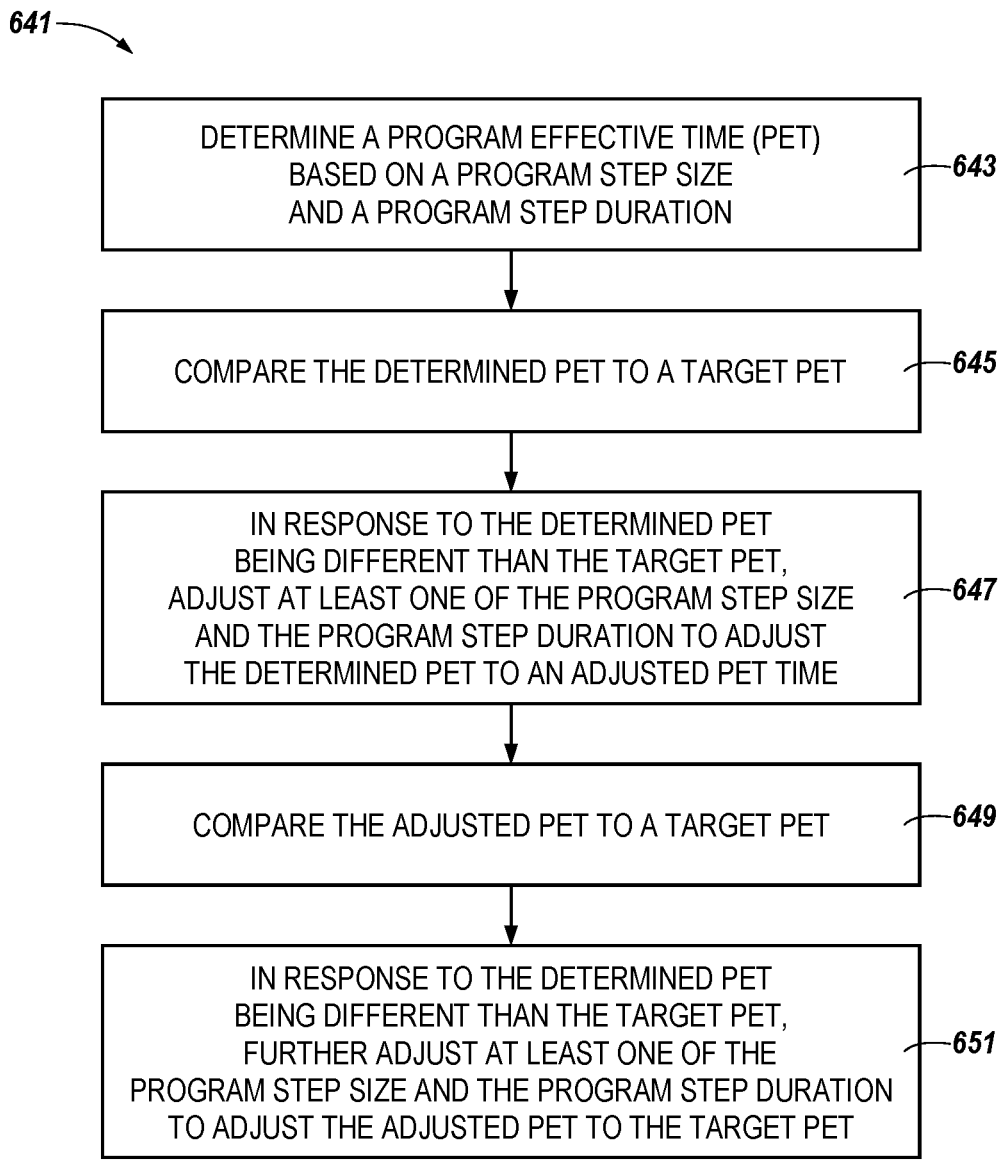
FIG. 6 is a flow diagram of an example method corresponding to adjusting one or more program step characteristics for programming memory cells in accordance with some embodiments of the present disclosure.

FIG. 6 is a flow diagram of an example method 641 corresponding to adjusting one or more program step characteristics (e.g., one or more of a program step size and a program step duration) for programming memory cells in accordance with some embodiments of the present disclosure. The method 641 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 641 is performed by the program step characteristic component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 643, the processing device determines a program effective time (PET) based on one or more program step characteristics (e.g., one or more of a program step size and a program step duration). At block 645, the processing device compares the determined PET to a specific PET. The specific PET can be provided by an input to the memory system. The specific PET can be provided based on an error threshold and/or other parameters or thresholds that can limit a PET value. At block 647, the processing device adjusts, in response to the determined PET being different than the target PET, one or more program step characteristics. As indicated in Table 1 above, either of a program step size and a program step duration can be adjusted, or both can be adjusted, to achieve a particular PET that can be in line with the specific PET.

At block 649, the processing device compares the adjusted PET to the target PET. At block 651, the processing device further adjusts, in response to the adjusted PET being different than the target PET, one or more program step characteristic. As an example, the initial attempt of adjustment of the PET from the determined PET to the target PET may have some errors and this second comparison could identify those errors and adjust again. In the alternative, parameters while operating the memory could create anomalies in the memory cells and an adjustment to realign the PET to the target PET may be performed. These anomalies can be created by wearing on the memory cells from many reads and/or writes to and from the cells. These anomalies can be created by temperature fluctuations that may damage and/or alter the memory cells. Whiles these examples are given, examples are not so limited. Any parameters that affect the memory cells and their ability to be programmed could affect the PET and use additional adjustment. This repetition of adjustment can be performed in a dynamic feedback loop where each subsequently adjusted PET is compared to a previously adjusted PET in order to fine tune the working PET to be the same as the target PET.

Figure 7:
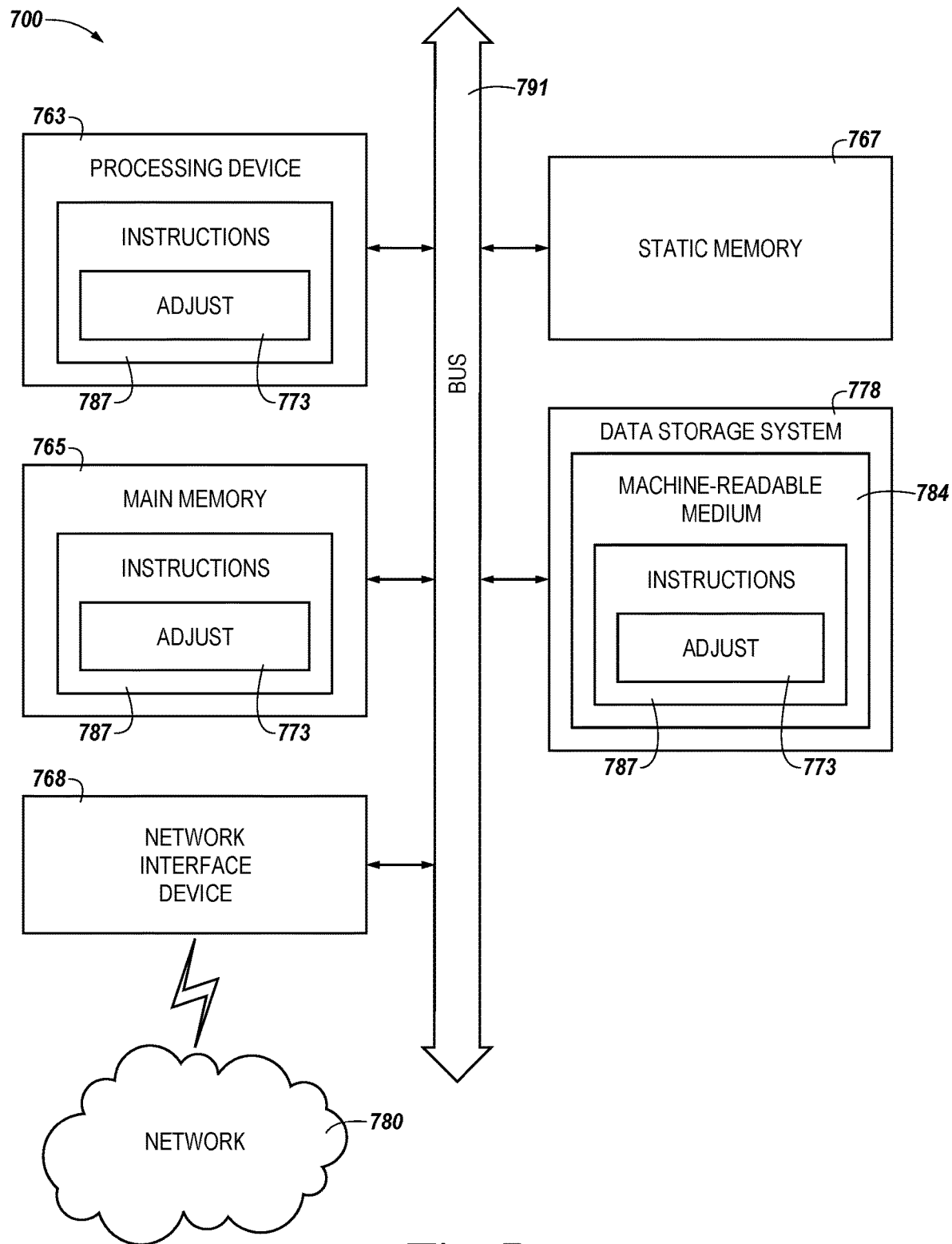
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 102 of FIG. 1) that includes, is coupled to, or utilizes a memory sub-system (e.g., the memory sub-system 104 of FIG. 1) or can be used to perform the operations of a controller (e.g., to adjust a parameter associated with programming a memory cell, such as program step characteristic component 113. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 763, a main memory 765 (e.g., read-only memory (ROM), flash memory, dynamic random access memory (DRAM) such as synchronous DRAM (SDRAM) or Rambus DRAM (RDRAM), etc.), a static memory 767 (e.g., flash memory, static random access memory (SRAM), etc.), and a data storage system 779, which communicate with each other via a bus 791.

Processing device 763 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 763 can also be one or more special-purpose processing devices such as an application specific integrated circuit (ASIC), a field programmable gate array (FPGA), a digital signal processor (DSP), network processor, or the like. The processing device 763 is configured to execute instructions 787 for performing the adjustment operations using an adjustment component 773 (including either or both of the program step size component and the program step duration component previously described) and steps discussed herein. The computer system 700 can further include a network interface device 768 to communicate over the network 780.

The data storage system 779 can include a machine-readable storage medium 784 (also known as a computer-readable medium) on which is stored one or more sets of instructions 787 or software embodying any one or more of the methodologies or functions described herein. The instructions 787 can also reside, completely or at least partially, within the main memory 765 and/or within the processing device 763 during execution thereof by the computer system 700, the main memory 765 and the processing device 763 also constituting machine-readable storage media. The machine-readable storage medium 784, data storage system 779, and/or main memory 604 can correspond to the memory sub-system 104 of FIG. 1.

In one embodiment, the instructions 787 include instructions to implement functionality corresponding to a program step characteristic component (e.g., program step characteristic component 113 of FIG. 1). While the machine-readable storage medium 784 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
   a memory component including a plurality of memory cells; and
   a processing device coupled to the memory component and configured to:
   determine a program effective time (PET) for programming at least a portion of the plurality of memory cells based on one or more program step characteristics, wherein the one or more program step characteristics comprises one or more of a program step size and a program step duration;
   compare the determined PET to a target PET;
   determine a particular proportion of adjustment of the program step size and the program step duration to adjust the determined PET toward the target PET; and
   in response to the determined PET being different than the target PET and independent of the one or more program step characteristics reaching a threshold, adjust the program step size and the program step duration to adjust the determined PET to the target PET, wherein adjustment of the program step size is in the particular proportion to the adjustment of the program step duration based on a determined relationship between the program step size and the program step duration.

2. The system of claim 1, wherein the processing device is further configured to adjust the program step size without adjusting a program step duration to adjust the determined PET to the target PET.

3. The system of claim 1, wherein the processing device is further configured to adjust the program step duration without adjusting a program step size to adjust the determined PET to the target PET.

4. The system of claim 1, wherein the processing device configured to adjust the one or more program step characteristics comprises the processing device configured to:
   adjust the program step size a particular amount to adjust the determined PET a first particular degree;
   adjust the program step duration a particular amount to adjust the determined PET a second particular degree; and
   in response to adjusting the determined PET the first particular degree and the second particular degree, adjusting the determined PET to the target PET.

5. The system of claim 1, wherein the processing device is further configured to adjust the one or more program step characteristics based on implementing a target calibration mechanism to calibrate a target profile during operation of the memory component.

6. The system of claim 1, wherein the processing device is further configured to balance a programming time and an error measure associated with writing the data in the memory component based on the one or more program step characteristics that is adjusted.

7. The system of claim 1, wherein the processing device is further configured to determine that the determined PET has changed from being at the target PET to a non-target PET.

8. The system of claim 7, wherein the processing device is further configured to, in response to determining that the determined PET is at the non-target PET, adjust one or more program step characteristics to adjust the non-target PET to the target PET.

9. The system of claim 1, wherein:
   the processing device is further configured to:
   determine a step threshold for adjusting a program step size; and
   determine a time threshold for adjusting a program step duration.

10. A method, wherein the method comprises:
    determining a program effective time (PET) for programming at least a portion of a plurality of memory cells of a memory component based on one or more program step characteristics, wherein the one or more program step characteristics comprises one or more of a program step size and a program step duration;

comparing the determined PET to a target PET;
determining a particular proportion of adjustment of the program step size and the program step duration to adjust the determined PET toward the target PET; and
in response to the determined PET being different than the target PET and independent of whether the one or more program step characteristics reaches a threshold, adjusting the program step size and the program step duration to adjust the determined PET to an adjusted PET, wherein adjustment of the program step size is in the particular proportion to the adjustment of the program step duration based on a determined relationship between the program step size and the program step duration;
comparing the adjusted PET to the target PET; and
in response to the adjusted PET being different than the target PET, further adjusting one or more of the program step characteristics to adjust the adjusted PET to the target PET.

11. The method of claim 10, further comprising repeating a comparison of a previously adjusted PET to the target PET.

12. The method of claim 11, wherein, in response to the previously adjusted PET being a different PET than the target PET, adjusting one or more of the program step characteristics until the previously adjusted PET is a same PET as the target PET.

13. The method of claim 10, wherein the memory component comprises a plurality of memory dies, and wherein the method further comprises:
programming each of the plurality of memory dies using the adjusted PET that is a same PET as the target PET.

14. A system, comprising:
a memory component including a plurality of memory cells; and
a processing device coupled to the memory component and configured to:
determine a particular proportion of concurrent adjustment of the program step size and the program step duration to adjust the determined PET toward the target PET; and
adjust one or more program step characteristics by determined amounts to adjust a program effective time (PET) for programming at least a portion of the plurality of memory cells, wherein:
the one or more program step characteristics comprise one or more of a program step size and a program step duration;
the program step size and the program step duration are adjusted based on a determined relationship between a program step size and a program step duration, wherein the program step size is adjusted the particular proportion with respect to the adjustment of the program step duration based on the determined relationship; and
the program step size and the program step duration are adjusted independent of the one or more program step characteristics having reached a threshold.

15. The system of claim 14, wherein the processing device is further configured to repeatedly adjust the one or more program step characteristics to maintain a constant PET at a target PET.

16. The system of claim 14, wherein the processing device is further configured to adjust the one or more program step characteristics in response to a change in programming of the memory component.

17. The system of claim 16, wherein the change in programming comprises a change due to wear cycling of the memory component.

18. The system of claim 16, wherein the change in programming comprises a temperature change in the memory component.

* * * * *